United States Patent
Kang et al.

(10) Patent No.: US 8,866,162 B2
(45) Date of Patent: Oct. 21, 2014

(54) ORGANIC LIGHT EMITTING DIODE DISPLAY AND METHOD OF MANUFACTURING THE SAME

(75) Inventors: Jin-Goo Kang, Yongin (KR); Mu-Hyun Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 1098 days.

(21) Appl. No.: 12/779,308

(22) Filed: May 13, 2010

(65) Prior Publication Data

US 2011/0133215 A1 Jun. 9, 2011

(30) Foreign Application Priority Data

Dec. 8, 2009 (KR) .................. 10-2009-0121361

(51) Int. Cl.
 H01L 29/04 (2006.01)
 H01L 31/20 (2006.01)
 H01L 27/32 (2006.01)
 H01L 51/56 (2006.01)

(52) U.S. Cl.
 CPC ....... *H01L 27/3279* (2013.01); *H01L 2227/323* (2013.01); *H01L 51/56* (2013.01)
 USPC .................. 257/88; 257/59; 257/71; 257/72; 257/79; 257/83; 257/98; 257/99; 257/100; 257/40; 438/34; 438/48; 438/149; 438/153; 438/151

(58) Field of Classification Search
 USPC ......... 257/88, 98, 99, 100, 79, 40, 59, 71, 72, 257/83; 438/34, 48, 149, 153, 128, 151
 See application file for complete search history.

(56) References Cited

U.S. PATENT DOCUMENTS

| 7,332,765 B2 * | 2/2008 | Iwata et al. .................. 257/314 |
| 2006/0255725 A1 * | 11/2006 | Kim .............................. 313/506 |
| 2008/0012474 A1 * | 1/2008 | Sung et al. .................... 313/504 |

FOREIGN PATENT DOCUMENTS

| JP | 2004006278 | 1/2004 |
| JP | 2005049808 | 2/2005 |
| JP | 2009016298 | 1/2009 |
| JP | 2009124108 | 6/2009 |
| KR | 1020050104157 | 11/2005 |
| KR | 20060059745 | 6/2006 |
| KR | 1020080063539 | 7/2008 |
| KR | 1020080085583 | 9/2008 |

* cited by examiner

*Primary Examiner* — Chuong A Luu
(74) *Attorney, Agent, or Firm* — Robert E. Bushnell, Esq.

(57) ABSTRACT

A method of manufacturing an organic light emitting diode (OLED) display includes forming an upper electrode power source line outside of a pixel area over a substrate, forming a lower electrode in the pixel area, forming at least one layer of an organic material layer in the pixel area and areas outside of the pixel area, forming an upper electrode in the pixel area, selectively removing portions of the organic material layer that are exposed outside of the upper electrode, thereby exposing the upper electrode power source line, and coating a conductive material between the upper electrode and the upper electrode power source line in a normal pressure condition such that the conductive material overlaps the upper electrode and the upper electrode power source line, thereby forming a connection portion.

24 Claims, 6 Drawing Sheets

ORGANIC LIGHT EMITTING DIODE DISPLAY AND METHOD OF MANUFACTURING THE SAME

CROSS-REFERENCE TO RELATED APPLICATIONS

This application claims the benefit of Korean Patent Application No. 10-2009-0121361, filed Dec. 8, 2009 in the Korean Intellectual Property Office, the disclosure of which is incorporated herein by reference.

BACKGROUND

1. Field

Aspects of the present invention relate to an organic light emitting diode (hereinafter referred to as "OLED") display. More particularly, aspects of the present invention relate to a method of manufacturing an upper electrode electrically connected to an upper electrode power source line and an OLED display including the upper electrode.

2. Description of the Related Art

An OLED display includes a pixel area including a plurality of pixels. Each of the pixels includes red, green, and blue sub-pixels. An organic light emitting element is formed in each sub-pixel and includes a lower electrode, an organic emission layer, and an upper electrode. The organic emission layer is multilayered, and includes a hole injection layer, a hole transport layer, an emission layer, an electron transport layer, and an electron injection layer.

Upper and lower power source voltage lines are provided outside of the pixel area. The upper and lower power source voltage lines supply the pixel area with a power source voltage. A scan driver is provided outside of the pixel area and outputs a selection signal to the pixel area. A data driver is provided outside of the pixel area and outputs a data signal to the pixel area. An upper electrode power source line is provided outside of the pixel area and supplies the upper electrode with a driving voltage.

The upper electrode power source line is covered with an insulation layer. At least one contact hole is formed in the insulation layer to expose a part of the upper electrode power source line. Further, the upper electrode is formed in the entire pixel area and at the outside of the pixel area (i.e., at least one contact hole). The upper electrode is brought into contact with the upper electrode power source line and is electrically connected thereto.

In a process of forming the organic light emitting element, at least one organic material layer (e.g., the hole injection layer and the hole transport layer) is formed using a liquid coating method, such as spin coating. However, the organic material layer formed using the liquid coating method is formed not only in the pixel area, but also at unwanted areas, including areas for the scan driver, the data driver, and the contact holes for the upper electrode power source line that are formed outside of the pixel area. If the organic material layer formed at the outside of the pixel area is not removed, subsequent processes cannot be smoothly performed. For example, the organic material layer is also formed over the upper electrode power source line exposed by the contact holes. Accordingly, if the organic material layer is not removed, the upper electrode and the upper electrode power source line cannot be connected to each other in a subsequent process of forming the upper electrode.

The above information disclosed in this Background section is only for enhancement of understanding of the background of the invention and therefore it may contain information that does not form the prior art that is already known in this country to a person of ordinary skill in the art.

SUMMARY

Aspects of the present invention provide an organic light emitting diode (OLED) display and a method of manufacturing the same, having advantages of effectively removing an organic material layer outside of a pixel area while protecting the pixel area, and of improving the light emitting characteristic of an organic light emitting element by minimizing contact resistance between an upper electrode and an upper electrode power source line when connecting them.

According to an aspect of the invention, a method of manufacturing an organic light emitting diode (OLED) display includes forming an upper electrode power source line outside of a pixel area over a substrate, forming a lower electrode in the pixel area, forming at least one layer of an organic material layer in the pixel area and areas outside of the pixel area, forming an upper electrode in the pixel area, selectively removing portions of the organic material layer that are exposed outside of the upper electrode, thereby exposing the upper electrode power source line, and coating a conductive material between the upper electrode and the upper electrode power source line in a normal pressure condition such that the conductive material overlaps the upper electrode and the upper electrode power source line, thereby forming a connection portion.

According to an aspect of the invention, the organic material layer may be a multilayer of a hole injection layer and a hole transport layer.

According to aspects of the invention, the method may further include forming an emission layer, an electron transport layer, and an electron injection layer over the hole transport layer in the pixel area before forming the upper electrode.

According to an aspect of the invention, the organic material layer may be a multilayer of the hole injection layer, the hole transport layer, an electron transport layer, and an electron injection layer.

According to an aspect of the invention, the method may further include forming an emission layer on the hole transport layer in the pixel area before forming the electron transport layer.

According to an aspect of the invention, the emission layer may be formed for every subpixel in the pixel area using an inkjet printing method.

According to an aspect of the invention, the upper electrode may be formed using any one of a vacuum deposition method and a sputtering method.

According to an aspect of the invention, portions of the organic material layer that are exposed outside of the upper electrode may be selectively removed using any one of a laser radiation method and a plasma etch method in a state in which the pixel area is protected by the upper electrode.

According to an aspect of the invention, the connection portion may be formed using any one of a screen printing method, an inkjet printing method, a nozzle printing method, and an offset printing method.

According to aspects of the invention, the connection portion may include nanoparticles of at least one of aluminum (Al), copper (Cu), gold (Au), palladium (Pd), and platinum (Pt), and may have a thickness of 20 nm to 1 mm.

According to an aspect of the invention, the upper electrode power source line may be formed simultaneously with a thin film transistor in the pixel area.

According to an aspect of the invention, the thin film transistor may include a gate electrode, and a source electrode and a drain electrode placed over the gate electrode.

According to an aspect of the invention, the interlayer insulating layer may be interposed between the source electrode and the drain electrode.

According to an aspect of the invention, the upper electrode power source line may be formed simultaneously with the source electrode and the drain electrode.

According to aspects of the invention, the method may further include forming an insulating film over the source electrode, the drain electrode, and the upper electrode power source line, and forming a contact hole through which the drain electrode may be exposed and at least one contact hole through which the upper electrode power source line may be exposed in the insulating film.

According to aspects of the invention, the lower electrode may be connected to the drain electrode through the contact hole formed in the insulating film.

According to aspects of the invention, the connection portion may connect the upper electrode and the upper electrode power source line that are exposed by the contact hole formed in the insulating film.

An OLED display according to an exemplary embodiment of the present invention includes a plurality of organic light emitting elements each formed in a pixel area over a substrate and configured to include a lower electrode and an organic emission layer, an upper electrode formed in the pixel area over the organic emission layer, an upper electrode power source line formed at the outside of the pixel area, and a connection portion formed between the upper electrode and the upper electrode power source line such that the connection portion overlaps the upper electrode and the upper electrode power source line. The connection portion includes nanoparticles of at least one of aluminum (Al), copper (Cu), gold (Au), palladium (Pd), and platinum (Pt), and has a thickness of 20 nm to 1 mm.

According to aspects of the invention, the upper electrode may have a thickness of 5 nm to 200 nm.

According to an aspect of the invention, the emission layer may be formed for every subpixel in the pixel area using an inkjet printing method.

According to an aspect of the invention, the coating the conductive material may include using may one of a screen printing method, an inkjet printing method, a nozzle printing method, and an offset printing method to coat the conductive material and form the connection portion.

According to an aspect of the invention, the formed connection portion may include nanoparticles of at least one of aluminum (Al), copper (Cu), gold (Au), palladium (Pd), and platinum (Pt), and may have a thickness of 20 nm to 1 mm.

According to an expect of the invention, a method of manufacturing an organic light emitting diode (OLED) display includes forming at least one layer of an organic material layer on a lower electrode in a pixel area and an upper electrode power source line in an area outside of the pixel area, forming an upper electrode on the formed organic material layer in the pixel area but not contacting the upper electrode power source line so as to expose a portion of the organic material layer on the upper electrode power source line, removing the exposed portion of the organic material layer to expose the upper electrode power source line, and coating a conductive material to electrically connect the formed upper electrode and the exposed upper electrode power source line.

According to an aspect of the invention, the forming the organic material layer may include a liquid coating method to form the organic material layer.

According to an aspect of the invention, the forming the upper electrode may include using a thin film process to form the upper electrode.

According to an aspect of the invention, the coating the conductive material may include a printing process to apply the conductive material.

According to an aspect of the invention, the coating the conductive material may include a printing process to apply the conductive material.

According to an aspect of the invention, the coated conductive material may be thicker than the formed upper electrode.

According to an aspect of the invention, the coated conductive material may have a thickness of at or between 20 nm and 1 mm, and the formed upper electrode may have a thickness of at or between 5 nm and 200 nm.

According to an aspect of the invention, the forming the upper electrode may include forming the upper electrode in a deposition chamber using a deposition mask, the removing the exposed portion may include removing a substrate on which the upper electrode is formed from the deposition chamber and using one of a laser removal method of plasma etching method of the exposed portion to remove the exposed portion of the organic material layer, and the coating the conductive material may include printing the conductive material at a normal pressure using any one of a screen printing method, an inkjet printing method, a nozzle printing method, and an offset printing method.

According to an aspect of the invention, a method of manufacturing an organic light emitting diode (OLED) display includes using a thin film process to form an upper electrode on an organic material layer in a pixel area so as to not contact an upper electrode power source line in an area outside of the pixel area, and coating a conductive material to electrically connect the formed upper electrode and the upper electrode power source line using a non-thin-film process.

According to an aspect of the invention, the coating the conductive material may include printing the conductive material onto the formed upper electrode and the upper electrode power source line.

According to an aspect of the invention, the printing may include using any one of a screen printing method, an inkjet printing method, a nozzle printing method, and an offset printing method to print the conductive material.

According to an aspect of the invention, the conductive material may include a mixture of an organic material and conductive particles.

According to an aspect of the invention, the coated conductive material may be thicker than the formed upper electrode.

According to an aspect of the invention, the coated conductive material may have a thickness of at or between 20 nm and 1 mm, and the formed upper electrode may have a thickness of at or between 5 nm and 200 nm.

According to an aspect of the invention, the forming the upper electrode may include forming the upper electrode in a deposition chamber using a deposition mask, and the coating the conductive material may include removing the formed upper electrode from the deposition chamber and printing the conductive material at a normal pressure outside of the deposition chamber.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
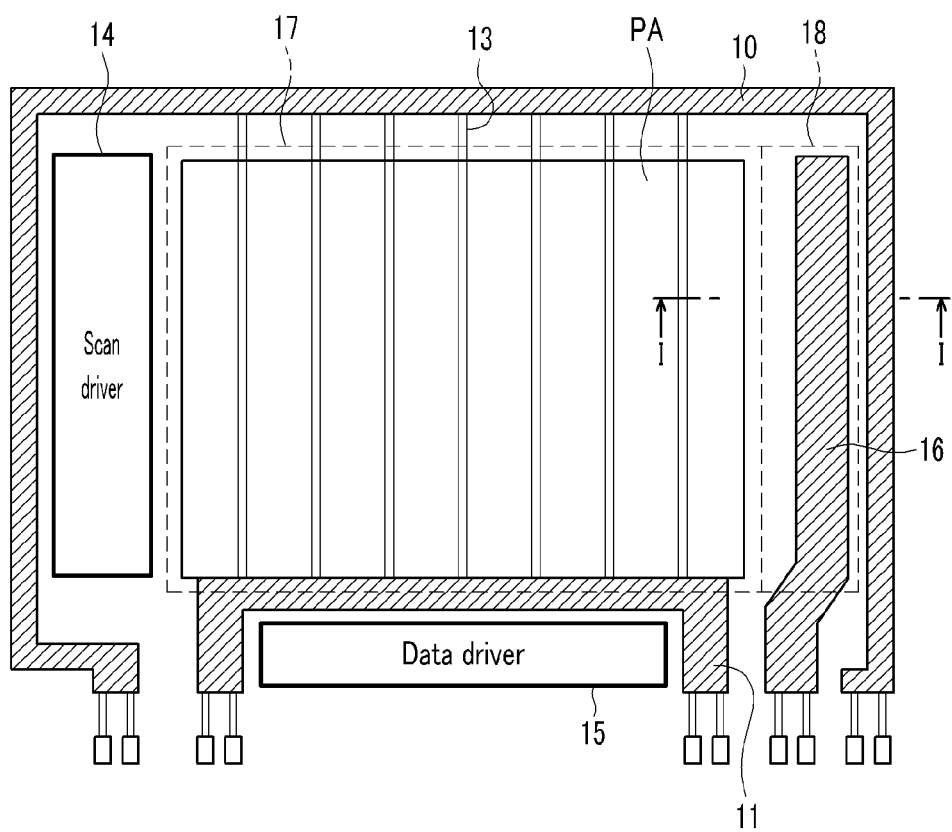
FIG. 1 is a top plan view of an OLED display according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

To clarify a description of embodiments of the present invention, parts not related to the description are omitted, and the same reference numbers will be used throughout the drawings to refer to the same or like parts. Further, the size and thickness of each of the elements shown in the drawings are arbitrarily shown for better understanding and ease of description, and the present invention is not limited thereto. For instance, in the drawings, the thickness of layers, films, panels, areas, etc., are exaggerated for clarity. The thickness of the layers and areas are exaggerated in the drawings for better understanding and ease of description. It will be understood that when an element such as a layer, film, area, or substrate is referred to as being "on" another element, it can be directly on the other element or intervening elements may also be present.

FIG. 1 is a top plan view of an OLED display 100 according to an exemplary embodiment of the present invention. The OLED display 100 includes a pixel area PA, an upper power source voltage line 10, a lower power source voltage line 11, and a pixel power source voltage line 13.

The pixel area PA is an area in which a plurality of pixels is formed. The upper power source voltage line 10 is arranged on the upper, left, and right sides of the pixel area PA, and is configured to supply the pixel area PA with a power source voltage. The lower power source voltage line 11 is arranged on the lower side of the pixel area PA, and is configured to supply the pixel area PA with a power source voltage. The pixel power source voltage line 13 is connected to the upper power source voltage line 10 and the lower power source voltage line 11 and is formed in the pixel area PA.

The OLED display 100 further includes a scan driver 14, a data driver 15, and an upper electrode power source line 16. The scan driver 14 is configured to output a selection signal to the pixel area PA. The data driver 15 is configured to output a data signal to the pixel area PA. The upper electrode power source line 16 is placed between the pixel area PA and the upper power source voltage line 10. The scan driver 14 and the data driver 15 are placed at the outside of the pixel area PA.

Each of the pixels includes red, green, and blue sub-pixels. An organic light emitting element (not shown) is formed in each of the sub-pixels. The organic light emitting element includes a lower electrode, an organic emission layer, and an upper electrode 17. The upper electrode 17 is a common electrode and is formed in the entire pixel area PA. A connection portion 18 is formed between the upper electrode 17 and the upper electrode power source line 16, and is configured to electrically connect the upper electrode 17 and the upper electrode power source line 16.

Hereinafter, a method of manufacturing the OLED display 100 according to exemplary embodiment of the present invention is described with reference to FIGS. 2A to 2F. FIGS. 2A to 2F are cross-sectional views of the OLED display 100 taken along line II-II of FIG. 1, and show one of the sub-pixels placed in the pixel area PA and the upper electrode power source line 16 placed at the outside of the pixel area PA.

Figure 2A:
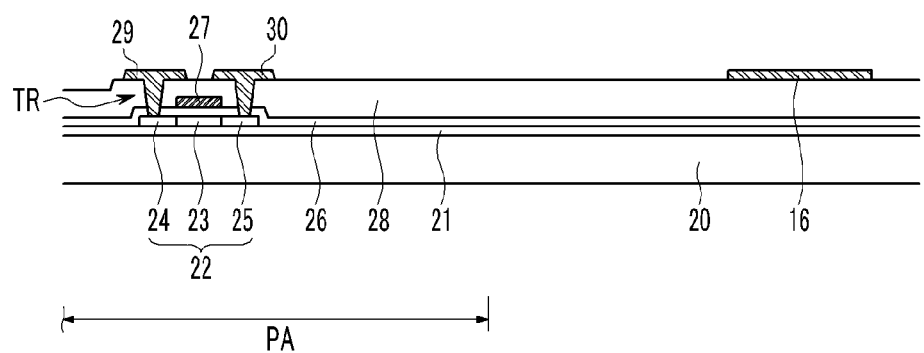
FIGS. 2A to 2F illustrate a method of manufacturing the OLED display according to an exemplary embodiment of the present invention.

Referring to FIG. 2A, a buffer layer 21 is formed on the entire substrate 20, including the pixel area PA and an area outside of the pixel area PA. The buffer layer 21 is formed directly on the substrate 20 and is configured to protect a thin film transistor TR, formed in a subsequent process, from impurities drained from the substrate 20. The buffer layer 21 can include at least one of $SiN_x$, $SiO_2$, and $SiO_xN_y$.

A semiconductor layer 22 is formed on the buffer layer 21 within the pixel area PA. The semiconductor layer 22 may be formed of a polysilicon film or may be formed by depositing an amorphous polysilicon film and crystallizing the amorphous polysilicon film. The semiconductor layer 22 includes a channel area 23 in which impurities are not doped and a source area 24 and a drain area 25 in which impurities are doped. The source area 24 and the drain area 25 are placed on both sides of the channel area 23. An ionic material doped in the source area 24 and the drain area 25 can include p-type impurities, such as boron (B).

The thin film transistor TR can have a PMOS structure using p-type impurities, an NMOS structure using n-type impurities, or a CMOS structure using c-type impurities.

A gate insulating layer 26 is formed on the buffer layer 21 in such a way so as to cover the semiconductor layer 22. The gate insulating layer 26 can include $SiN_x$ or $SiO_2$. A gate wire, including a gate electrode 27, is formed on the gate insulating layer 26. The gate electrode 27 is formed to overlap a part (in particular, the channel area 23) of the semiconductor layer 22.

An interlayer insulating layer 28 is formed on the gate insulating layer 26 and is configured to cover the gate electrode 27. The interlayer insulating layer 28 can include $SiN_x$ or $SiO_2$, like the gate insulating layer 26. Next, the interlayer insulating layer 28 and the gate insulating layer 26 are partially removed to form contact holes through which the source area 24 and the drain area 25 are exposed.

A data wire, including a source electrode 29 and a drain electrode 30, is formed on the interlayer insulating layer 28. The source electrode 29 is connected to the source area 24 of the semiconductor layer 22 through one of the contact holes. The drain electrode 30 is connected to the drain area 25 of the semiconductor layer 22 through another one of the contact hole. Accordingly, the thin film transistor TR including the semiconductor layer 22, the gate electrode 27, the source electrode 29, and the drain electrode 30 is completed.

The OLED display 100 can include a switching thin film transistor, a driving thin film transistor, and a capacitor in each subpixel. FIG. 2A shows only the driving thin film transistor TR for convenience of description. The driving thin film transistor TR is not limited to the above construction, and can be modified in various ways. Alternatively, the OLED display 100 may include three or more thin film transistors and two or more capacitors in each subpixel.

The upper electrode power source line 16 is formed at the outside of the pixel area PA. The upper electrode power source line 16 can be formed simultaneously with the thin film transistor TR. In more detail, the upper electrode power source line 16 can be formed simultaneously with the gate electrode 27 over the gate insulating layer 26, or can be formed simultaneously with the source electrode 29 and the drain electrode 30 over the interlayer insulating layer 28. FIG. 2A shows the case in which the upper electrode power source line 16 has been formed simultaneously with the source electrode 29 and the drain electrode 30 over the interlayer insulating layer 28.

When the upper electrode power source line 16 is formed simultaneously with the source electrode 29 and the drain electrode 30, a conductive layer is formed on the interlayer insulating layer 28 by depositing a conducting material thereon. The formed conductive layer is patterned to form the source electrode 29, the drain electrode 30, and the upper electrode power source line 16. Accordingly, the upper electrode power source line 16 includes the same components as the source electrode 29 and the drain electrode 30, and has the same thickness as the source electrode 29 and the drain electrode 30.

Figure 2B:
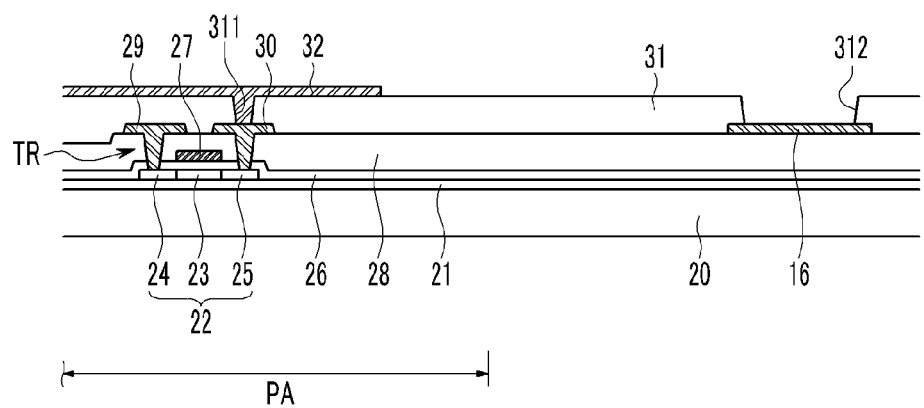

Referring to FIG. 2B, an insulating film 31 is formed on the interlayer insulating layer 28, thus covering the source electrode 29, the drain electrode 30, and the upper electrode power source line 16. A planarization layer may be further formed on the insulating film 31, or the insulating film 31 itself may be formed as a planarization layer. The planarization layer is formed flat in such a way so as to cover the steps or the surface curves of the members previously formed. Therefore, the planarization layer makes the organic light emitting elements to be formed thereon flat, thereby helping increase luminous efficiency. A part of the insulating film 31 is removed to form a contact hole 311 through which the drain electrode 30 is exposed and a contact hole 312 through which the upper electrode power source line 16 is exposed.

The insulating film 31 can include one or more of polyacrylate resin, epoxy resin, phenolic resin, polyamide resin, polyimide resin, unsaturated polyester resin, polyphenylenether resin, polyphenylenesulfide resin, and benzocyclobutene (BCB).

A lower electrode 32 is formed on the insulating film 31 of the pixel area PA and constitutes the organic light emitting element. The lower electrode 32 is a pixel electrode and is placed in each subpixel. The lower electrode 32 is connected to the drain electrode 30 through the contact hole 311 formed in the insulating film 31. The lower electrode 32 can be a hole injection electrode, and may be made of a transparent and conductive material or a semi-transparent and conductive material. While not limited thereto, the transparent and conductive material used for the lower electrode 32 can be indium tin oxide (ITO), indium zinc oxide (IZO), zinc oxide (ZnO), or indium oxide ($In_2O_3$). While not limited thereto, the semi-transparent and conductive material used for the lower electrode 32 can be at least one of magnesium (Mg), silver (Ag), calcium (Ca), lithium (Li), and aluminum (Al).

Figure 2C:
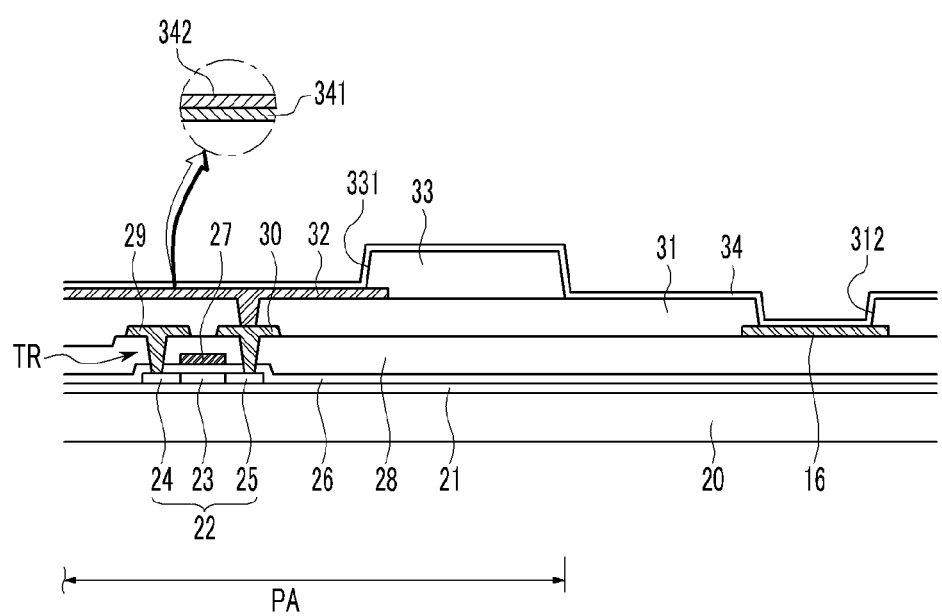

Referring to FIG. 2C, a pixel definition layer 33 is formed on the insulating film 31 of the pixel area PA and covers the lower electrode 32. An opening 331 is formed in the pixel definition layer 33, thus exposing the lower electrode 32. A portion in which the pixel definition layer 33 is formed corresponds to an area between the subpixels. That is, an emission layer (not shown) that actually emits light is subsequently formed in the opening 331 of the pixel definition layer 33. Accordingly, the pixel definition layer 33 functions to define an area in which the emission layer will be formed in each subpixel.

The pixel definition layer 33 can include one of polyacrylate resin, polyimide resin, $SiN_x$, and an inorganic material such as $SiO_2$. The pixel definition layer 33 can be formed only in the pixel area PA. In this case, the pixel definition layer 33 does not cover the upper electrode power source line 16 and the insulating film 31 outside of the pixel area PA. However, the invention is not limited thereto.

At least one organic material layer 34 is formed in the pixel area PA and the areas outside of the pixel area PA using a liquid coating method, such as spin coating. If the liquid coating method is used, the organic material layer 34 having a thin and uniform thickness can be formed easily and rapidly. As shown, the organic material layer 34 becomes a hole injection layer (HIL) 341 and a hole transport layer (HTL) 342.

As described above, the organic material layer 34 formed using the liquid coating method covers the upper electrode power source line 16 because it is formed in not only the pixel area PA, but also in the areas outside of the pixel area PA. In other words, the organic material layer 34 is formed on the insulating film 31 outside of the pixel area PA and on the upper electrode power source line 16 that is exposed by the contact hole 312 formed in the insulating film 31. Thus, the upper electrode power source line 16 has to be exposed again by removing the organic material layer 34 outside of the pixel area PA.

Figure 2D:
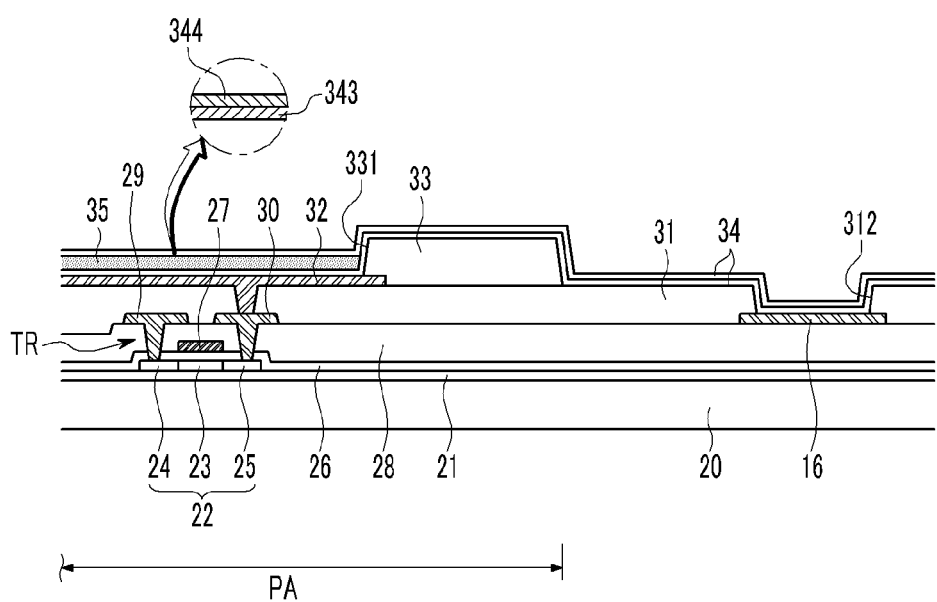

Referring to FIG. 2D, before removing the organic material layer 34 outside of the pixel area PA, an emission layer 35 is formed on the HTL 342 corresponding to the opening 331 formed in the pixel definition layer 33. The emission layer 35 is selectively formed only in a region corresponding to the opening 331 of the pixel definition layer 33. The emission layer 35 can be formed by spraying a material for forming the emission layer 35 only toward a specific area using an inkjet spray method. The emission layer 35 may be formed using methods other than the inkjet spray method.

Another organic material layer 34 is formed over the emission layer 35. The another organic material layer 34 includes an electron transport layer (ETL) 343 and an electron injection layer (EIL) 344. Accordingly, the organic emission layer including the HIL 341, the HTL 342, the emission layer 35, the ETL 343, and the EIL 344 is completed.

The ETL 343 and the EIL 344 can be formed only over the emission layer 35 (a first case), or can be formed both in the pixel area PA and the areas outside of the pixel area PA using the liquid coating method such as spin coating (a second case). FIG. 2D shows the second case in which the ETL 343 and the EIL 344 are formed both in the pixel area PA and the areas outside of the pixel area PA using the liquid coating method such as spin coating. In the second case, the organic material layer 34 formed both in the pixel area PA and the areas outside of the pixel area PA includes the ETL 343 and the EIL 344 in addition to the HIL 341 and the HTL 342.

Figure 2E:
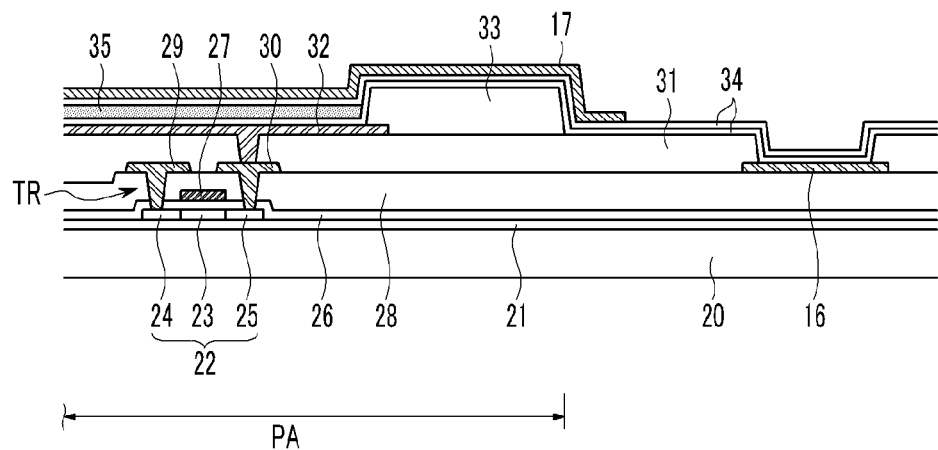

Referring to FIG. 2E, the upper electrode 17 (i.e., a common electrode) is formed in the entire pixel area PA using a thin film process, such as vacuum deposition or sputtering. An area in which the upper electrode 17 is formed can be larger than the pixel area PA as shown, but the invention is not limited thereto. The upper electrode 17 can be an electron injection electrode, and can be made of reflective and conductive material. Thus, the shown OLED display 100 is formed as a back light-emitting type. That is, light emitted from the emission layer 35 is reflected by the upper electrode 17. The reflected light passes through the lower electrode 32, the thin film transistor TR, and the substrate 20, thus displaying an image.

The upper electrode 17 can include at least one of aluminum (Al), silver (Ag), magnesium (Mg), gold (Au), lithium (Li), calcium (Ca), lithium fluoride/calcium (LiF/Ca), and lithium fluoride/aluminum (LiF/Al). Further, the upper electrode 17 can be a multilayer made of a transparent and conductive material and a reflective and conductive material.

The upper electrode 17 is a thin film formed by a thin film process, such as vacuum deposition or sputtering, and it can have a thickness of about 5 nm to 200 nm. In more detail, the upper electrode 17 can be formed by evaporating a conductive material within a deposition chamber (not shown) equipped with a deposition mask. Here, the deposition mask is used to form one opening corresponding to the pixel area PA, and the inside of the deposition chamber is in a high vacuum state.

The upper electrode 17 is formed in the pixel area PA. Accordingly, a portion of the organic material layer 34, corresponding to the pixel area PA, is covered with the upper electrode 17. In contrast, portions of the organic material layer 34, corresponding to the areas outside of the pixel area PA, are not covered by the upper electrode 17 and are exposed externally. Thus, the upper electrode 17 can be used to selectively remove the externally exposed portions of the organic material layer 34 while protecting the pixel area PA. To this end, the substrate 20 is drawn out from the deposition chamber and then moved to laser equipment (not shown) or plasma etch equipment (not shown).

In the case in which the laser removal method is used, the externally exposed portions of the organic material layer 34 are removed in such a manner that the organic material layer 34 is evaporated by the energy of a laser beam by irradiating a laser beam to the exposed portions. In this process, the upper electrode 17 functions to prevent the evaporated organic material from coming into contact with the organic material of the pixel area PA, thus preventing the light emitting characteristic of the pixel area PA from changing. An excimer laser, a $CO_2$ laser, or an Nd:YAG laser can be used as the laser beam. A laser of 100 mJ/$cm^2$ to 1000 mJ/$cm^2$ in energy range and of 193 nm to 351 nm in wavelength range can be used.

In the case in which the plasma etch method is used, only the externally exposed portions of the organic material layer 34 react to plasma because the upper electrode 17 functions as an etch mask. Accordingly, the externally exposed portions of the organic material layer 34 can be removed through a reaction with plasma. Oxygen ($O_2$), nitrogen ($N_2$), or argon (Ar) can be used as the plasma gas. Plasma etching can be performed both at a normal pressure or a high-vacuum condition. To prevent deformation of the organic light emitting element, the plasma etching can be performed at a temperature of 100° C. or less.

Figure 2F:
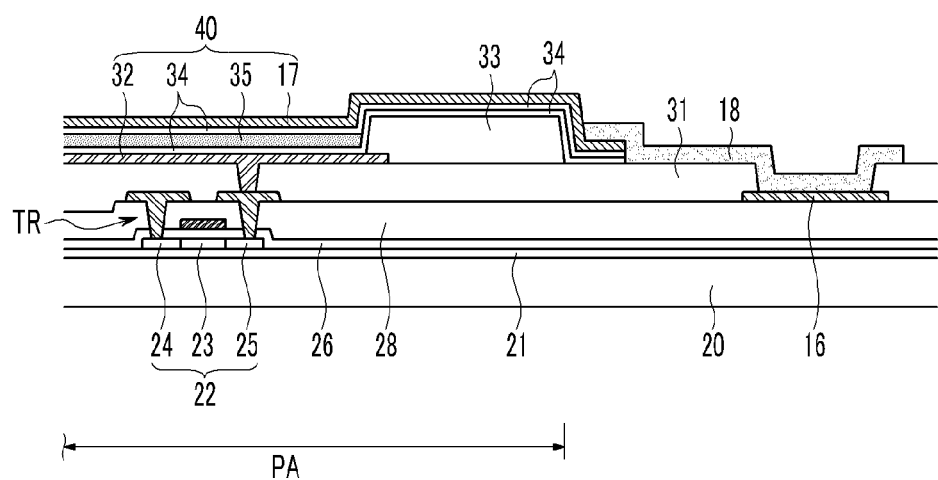

Referring to FIG. 2F, the portions of the organic material layer 34, which are exposed outside of the upper electrode 17, are removed using the laser removal method or the plasma etch method as described above. Accordingly, the insulating film 31 and the upper electrode power source line 16, which were covered with the organic material layer 34 in FIG. 2E, are again exposed. The upper electrode 17 is illustrated to exist in the pixel area PA in the state shown in FIG. 2F. However, as shown, the upper electrode 17 cannot be supplied with a voltage for driving the organic light emitting element 40 because it is separated from the upper electrode power source line 16.

As such, as shown in FIG. 2F, a conductive material is coated between the upper electrode 17 and the upper electrode power source line 16 in a normal condition such that it overlaps the upper electrode 17 and the upper electrode power source line 16, thereby forming the connection portion 18. The connection portion 18 is not formed using a thin film process such as vacuum deposition or sputtering, unlike the upper electrode 17, but is formed using a thick film process that can be performed at a normal pressure. In other words, the connection portion 18 can be formed using any one of a screen printing method, an inkjet printing method, a nozzle printing method, and an offset printing method.

The connection portion 18 is not an electrode coming into contact with the organic emission layer, but is a conductive path connecting the upper electrode 17 and the upper electrode power source line 16. Accordingly, the material, thickness, formation method, etc. of the connection portion 18 are not particularly limited. Further, the connection portion 18 can be formed using any printing method with a low process cost because a high degree of accuracy is not required to form the connection portion 18. Accordingly, the thick film process according to an exemplary embodiment of the present invention is advantageous in mass production because it can lower the material cost and the process cost as compared with the thin film process.

According to an aspect of the invention, an important factor in forming the connection portion 18 is conductivity. The shown connection portion 18 includes nanoparticles of at least one of aluminum (Al), copper (Cu), gold (Au), palladium (Pd), and platinum (Pt) with excellent conductivity. The nanoparticles have a size ranging from 1 nm to 1000 nm. However, it is understood that other factors, such as cost and availability, can be used to determine the properties of the connection portion 18.

In more detail, organic materials such as vehicles and binders are mixed with the above-described metal nanoparticles, thereby fabricating a mixture having suitable viscosity for printing. The mixture is coated using any one of a screen printing method, an inkjet printing method, a nozzle printing method, and an offset printing method. A dry or heat treatment process is performed on the coated mixture, thereby forming the connection portion 18. The connection portion 18 formed using the thick film process as described above has a thickness of about 20 nm to 1 mm and resistivity of about 100Ω/□ or less.

Assuming that the connection portion 18 is formed using vacuum deposition, an additional deposition chamber used with another deposition mask. The another deposition mask has a different shape from a deposition mask used for forming the upper electrode 17 because the connection portion 18 has a different shape from that of the upper electrode 17. That is, additional deposition chamber has to be added in order to form the connection portion 18. Further, the upper electrode 17 has to be formed by increasing the degree of vacuum in the deposition chamber. The substrate 20 has to be drawn out by lowering the degree of vacuum in the deposition chamber, and the portions of the organic material layer 34 outside of the pixel area PA have to be then removed. Next, the connection portion 18 has to be formed by increasing the degree of vacuum of the deposition chamber. Accordingly, the manufacturing process is complicated, and more time is required to fabricate the connection portion 18.

In the shown exemplary embodiment, however, the connection portion 18 is formed using a printing method in a normal pressure right after the portions of the organic material layer 34, placed at the outside of the pixel area PA, are removed. Accordingly, the degree of vacuum does not need to be controlled after the upper electrode 17 is formed, and the connection portion 18 can be easily formed with a low cost as compared with vacuum deposition. In the OLED display 100 of the present exemplary embodiment, the connection portion 18 has a thicker thickness than the upper electrode 17, and includes the above-described metal nanoparticles in order to secure high conductivity.

Figure 3A:
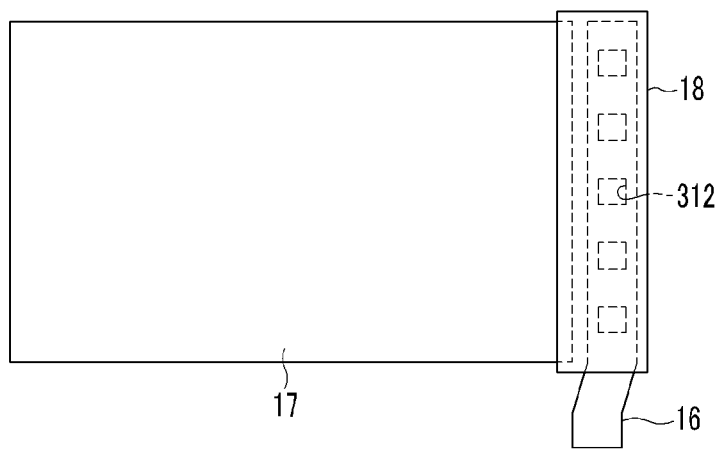
FIGS. 3A and 3B are top plan views schematically showing the plan shapes of an upper electrode and a connection portion of the OLED display according to the present exemplary embodiment.
Figure 3B:
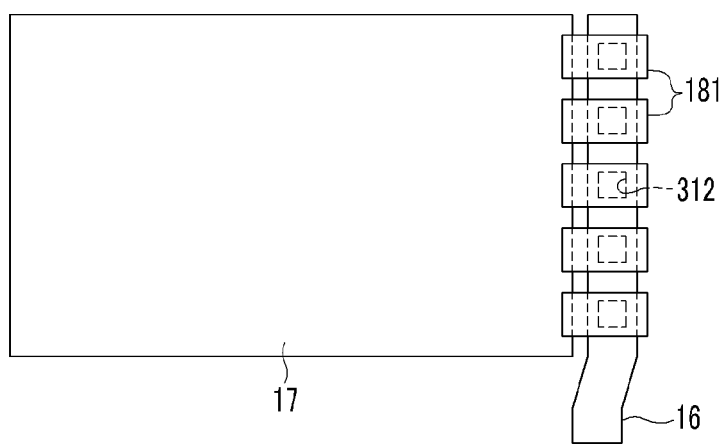

FIGS. 3A and 3B are top plan views schematically showing the plan shapes of the upper electrode 17 and the connection portion 18 of the OLED display 100 according to the present exemplary embodiment. Referring to FIG. 3A, one side of the upper electrode 17, placed toward the upper electrode power source line 16, is elongated outside of the pixel area. The connection portion 18 is formed to overlap a part of the upper electrode 17 and the entire upper electrode power source line 16 at the outside of the pixel area. One or more contact holes 312 are formed over the upper electrode power source line 16. The connection portion 18 comes into contact with the upper electrode power source line 16 through the contact holes 312. FIG. 3A shows a case in which the plurality of contact holes 312 are formed as an example.

Referring to FIG. 3B, one side of the upper electrode 17, placed toward the upper electrode power source line 16, is elongated outside of the pixel area. A plurality of contact holes 312 are formed along the length direction of the upper electrode power source line 16 over the upper electrode power source line 16. Further, a plurality of connection portions 181 are formed to correspond to the number of contact holes 312. The connection portions 181 are formed to overlap a part of the upper electrode 17 and to overlap the respective contact holes 312 at the outside of the pixel area.

The shapes of the connection portions 18 and 181 are not limited to the above examples. The connection portions 18 and 181 can have any shape as long as they can connect the upper electrode 17 and the upper electrode power source line 16.

In the OLED display 100 as constructed above, the organic material layer 34 outside of the pixel area PA can be effectively removed in the state in which the pixel area PA is protected by the upper electrode 17. Further, since a printing method that can be performed at a normal pressure condition is used, the connection portion 18 can be easily formed with a low cost and a simplified process. Furthermore, the connection portion 18 includes metal nanoparticles with excellent conductivity. Accordingly, electrical resistance between the upper electrode 17 and the upper electrode power source line 16 can be minimized, so the light emitting characteristic of the organic light emitting element 40 can be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting diode (OLED) display device, the method comprising:
   forming a thin film transistor within a pixel area over a substrate;
   forming an upper electrode power source line in an area outside of the pixel area;
   forming a lower electrode in the pixel area;
   forming at least one layer of an organic material layer in the pixel area and in the area outside of the pixel area;
   forming an upper electrode in the pixel area;
   selectively removing a portion of the organic material layer exposed outside of the upper electrode to expose the upper electrode power source line; and
   in the area outside of the pixel area, coating a conductive material between the upper electrode and the upper electrode power source line under a normal pressure condition such that the conductive material forms a connection portion which overlaps the upper electrode and the upper electrode power source line, the connection portion formed on and electrically connecting the upper electrode and the upper electrode power source line, the connection portion comprising a mixture of an organic material and conductive particles.

2. The method of claim 1, wherein the organic material layer comprises a multilayer of a hole injection layer and a hole transport layer.

3. The method of claim 2, further comprising forming an emission layer, an electron transport layer, and an electron injection layer over the hole transport layer in the pixel area before forming the upper electrode.

4. The method of claim 1, wherein the organic material layer is a multilayer of a hole injection layer, a hole transport layer, an electron transport layer, and an electron injection layer.

5. The method of claim 4, further comprising forming an emission layer on the hole transport layer in the pixel area before forming the electron transport layer.

6. The method of claim 3, wherein the emission layer is formed for every subpixel in the pixel area using an inkjet printing method.

7. The method of claim 1, wherein the upper electrode is formed using any one of a vacuum deposition method and a sputtering method.

8. The method of claim 7, wherein the selectively removing the portion of the organic material layer exposed outside of the upper electrode comprises using any one of a laser radiation method and a plasma etch method on the portion with the pixel area being protected by the upper electrode.

9. The method of claim 1, wherein the coating the conductive material comprises using any one of a screen printing method, an inkjet printing method, a nozzle printing method, and an offset printing method to coat the conductive material and form the connection portion.

10. The method of claim 9, wherein the formed connection portion comprises nanoparticles of at least one of aluminum (Al), copper (Cu), gold (Au), palladium (Pd), and platinum (Pt), and has a thickness of 20 nm to 1 mm.

11. The method of claim 1, wherein the upper electrode power source line is formed simultaneously with a formation of a portion of the thin film transistor in the pixel area.

12. The method of claim 11, wherein
   the thin film transistor comprises a gate electrode, a source electrode and a drain electrode placed over the gate electrode, and an interlayer insulating layer interposed between the gate electrode and the source and drain electrodes, and
   the upper electrode power source line is formed simultaneously with the source electrode and the drain electrode.

13. The method of claim 12, further comprising:
   forming an insulating film over the source electrode, the drain electrode, and the upper electrode power source line; and
   forming a contact hole in the formed insulating film through which the drain electrode is exposed and another contact hole in the formed insulating film through which the upper electrode power source line is exposed.

14. The method of claim 13, wherein the lower electrode is connected to the drain electrode through the contact hole formed in the insulating film.

15. The method of claim 13, wherein the connection portion connects the upper electrode and the upper electrode power source line exposed by the another contact hole formed in the insulating film.

16. An organic light emitting diode (OLED) display device, comprising:
   a pixel area comprising:
      a plurality of organic light emitting elements and a plurality of thin film transistors each driving a corresponding organic light emitting element, the plurality of organic light emitting elements and the plurality of thin film transistors being formed over a substrate, each organic light emitting element having a lower electrode and an organic emission layer and an upper electrode formed over the organic emission layer; and another area disposed outside of the pixel area, the another area comprising:

an upper electrode power source line, and a connection portion electrically connecting the upper electrode to the upper electrode power source line such that the connection portion overlaps the upper electrode and the upper electrode power source line, the connection portion comprising nanoparticles of at least one of aluminum (Al), copper (Cu), gold (Au), palladium (Pd), and platinum (Pt), and having a thickness of 20 nm to 1 mm.

17. The OLED display device of claim 16, wherein the upper electrode has a thickness of 5 nm to 200 nm.

18. An organic light emitting diode (OLED) display device, comprising:

a pixel area comprising:

a plurality of organic light emitting elements and a plurality of thin film transistors each driving a corresponding organic light emitting element, the plurality of organic light emitting elements and the plurality of thin film transistors being formed over a substrate, each organic light emitting element having a lower electrode and an organic emission layer and an upper electrode formed over the organic emission layer; and another area disposed outside of the pixel area, the another area comprising:

an upper electrode power source line, and a connection portion formed on and electrically connecting the upper electrode and the upper electrode power source line, the connection portion overlapping the upper electrode and the upper electrode power source line, the connection portion comprising a mixture of an organic material and conductive particles.

19. The OLED display device of claim 18, wherein the connection portion is thicker than the upper electrode.

20. The OLED display device of claim 19, wherein the connection portion has a thickness of at or between 20 nm and 1 mm, and the formed upper electrode has a thickness of at or between 5 nm and 200 nm.

21. The OLED display device of claim 18, wherein the conductive particles comprises nanoparticles of at least one of aluminum (Al), copper (Cu), gold (Au), palladium (Pd), and platinum (Pt), and has a thickness of 20 nm to 1 mm.

22. The OLED display device of claim 18, wherein the connection portion is formed on the upper electrode and the upper electrode power source line using a printing process, and the upper electrode is formed on the organic emission layer using a thin film process.

23. The OLED display of claim 18, further comprising an insulating layer on which the lower electrodes are formed and having, for each organic light emitting element, a contact hole extending to the upper electrode power source line, wherein the connection portion comprises connection elements and each connection element extends into only one of the contact holes to contact the upper electrode power source line.

24. The OLED display device of claim 18, further comprising an insulating layer on which the lower electrodes are formed and having, for each organic light emitting element, a contact hole extending to the upper electrode power source line, wherein the connection portion comprises a single sheet extending into the contact holes.

* * * * *